(12) United States Patent
Kim

(10) Patent No.: US 7,906,387 B2
(45) Date of Patent: Mar. 15, 2011

(54) METHOD FOR MANUFACTURING A TRANSISTOR

(75) Inventor: Bong Kil Kim, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 234 days.

(21) Appl. No.: 12/269,021

(22) Filed: Nov. 11, 2008

(65) Prior Publication Data

US 2009/0166737 A1 Jul. 2, 2009

(30) Foreign Application Priority Data

Dec. 27, 2007 (KR) .................. 10-2007-0138833

(51) Int. Cl.
*H01L 21/8238* (2006.01)
(52) U.S. Cl. ................. 438/199; 438/301; 257/E21.632
(58) Field of Classification Search .................. 438/197, 438/199, 301, 303, 306; 257/E21.632
See application file for complete search history.

(56) References Cited

U.S. PATENT DOCUMENTS

| 4,801,555 | A | 1/1989 | Holly et al. | |
| 7,615,430 | B2 * | 11/2009 | Pawlak | ........................ 438/199 |
| 2004/0171202 | A1 | 9/2004 | Kim | |

FOREIGN PATENT DOCUMENTS

KR 10-2006-0006593 A 1/2006

OTHER PUBLICATIONS

Jeong Hyeon Park; "Method for Fabricating High Voltage Transistor to Reduce Design Rule"; Korean Patent Abstracts; Publication No. 1020060006593 A; Publication Date: Jan. 19, 2006; Korean Intellectual Property Office, Republic of Korea.
Korean Office Action dated Jun. 1, 2009; Korean Patent Application No. 10-2007-0138833; Korean Intellectual Property Office, Republic of Korea.
Chinese Office Action with English Translation date stamped Jan. 15, 2010; Chinese Patent Application No. CN2008101888274; 10 pgs.; The State Intellectual Property Office of P.R.C., People's Republic of China.
German Office Action dated Aug. 6, 2010; German Patent Application No. P2008, 1070 DE N; 3 pages; German Patent and Trademark Office, Germany.

* cited by examiner

*Primary Examiner* — Hoai V Pham
(74) *Attorney, Agent, or Firm* — The Law Offices of Andrew D. Fortney; Andrew D. Fortney

(57) ABSTRACT

A method for manufacturing a transistor is disclosed, which is capable of improving matching characteristics of regions within a transistor or among transistors on a wafer, from wafer-to-wafer, or from lot-to-lot. The method includes forming a photoresist pattern on a semiconductor substrate including an isolation layer, forming a drift region by implanting first and second dopant ions using the photoresist pattern as a mask, forming a gate oxide layer on the semiconductor substrate, forming a poly gate on the gate oxide layer, forming source and drain regions a predetermined distance from the poly gate, and forming a silicide layer on the above structure.

12 Claims, 4 Drawing Sheets

US 7,906,387 B2

METHOD FOR MANUFACTURING A TRANSISTOR

This application claims the benefit of Korean Patent Application No. 10-2007-0138833, filed on Dec. 27, 2007, which is hereby incorporated by reference as if fully set forth herein.

BACKGROUND OF THE INVENTION

1. Field of the Invention

The present invention relates to a method for manufacturing a transistor, and more particularly, to a method for manufacturing a transistor capable of improving matching among transistors (e.g., on a wafer, from wafer-to-wafer, and/or from lot-to-lot) or among structures in a transistor.

2. Discussion of the Related Art

In a general driving circuit for a flat panel display such as an LCD, a PDP and an OLED which are recently growing in the market, a high-voltage device and a low-voltage device are integrated in one chip. Such a circuit is called a high-voltage integrated circuit. In order to design the high-voltage integrated circuit, models of a high-voltage metal oxide semiconductor (MOS) transistor and a low-voltage complementary MOS (CMOS) circuit transistor are useful.

FIG. 1A to FIG. 1D are sectional views showing the processes for forming a general drain-extended MOS (DEMOS) transistor.

Referring to FIG. 1A, active regions (for example, p-wells; not shown) are defined on a semiconductor substrate 10. After a barrier oxide layer 35 and a nitride layer (not shown) are vapor-deposited on the active regions, an isolation layer (not shown) is formed by shallow trench isolation (STI) to separate the respective active regions.

Next, a photoresist pattern 40 is formed by performing photolithography, and a drift region 45 is formed by performing a lightly doped drain (LDD) implantation using the photoresist pattern as a mask.

As shown in FIG. 1B, next, post-ion implant cleaning and annealing are performed, thereby activating cohesion between the implanted dopants and silicon atoms.

A gate oxide layer 50 is grown on the semiconductor substrate 10. Polysilicon is deposited (e.g., by vapor-depositing) on the gate oxide layer 50. A poly gate 60 is formed through photolithography and etching processes.

After this, spacers 70 are formed on sidewalls of the poly gate 60. Source and drain regions 80 are formed a predetermined distance from the poly gate 60 by ion implantation.

As shown in FIG. 1C, an oxide and/or a nitride is vapor-deposited on the whole surface of the resultant structure, and a photoresist pattern is formed on the oxide and/or nitride through photolithography using a non-silicide mask to expose parts of the oxide and/or nitride excluding a silicide region that will be formed later. In addition, a silicide barrier layer 90 is formed by etching the oxide or nitride by using the photoresist pattern as a mask.

Next, as shown in FIG. 1D, the photoresist pattern is removed and a silicide is vapor-deposited on the whole surface of the resultant structure. Additionally, a thermal processing and annealing are performed to form a silicide layer 95.

However, when the drift region formed by LDD implantation is used in the general DEMOS transistor, matching characteristics may deteriorate when the device size is increased. Furthermore, in the case of a device used in an electrostatic discharge (ESD) circuit, a non-silicide process including a non-silicide masking operation generally improves the ESD characteristics.

SUMMARY OF THE INVENTION

Accordingly, the present invention is directed to a method for manufacturing a transistor that substantially obviates one or more problems due to limitations and disadvantages of the related art.

An object of the present invention is to provide a method for manufacturing a transistor that is capable of improving matching characteristics among transistors.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure (s) particularly pointed out in the written description and claims hereof as well as the appended drawings.

To achieve these objects and other advantages and in accordance with the purpose(s) of the invention, as embodied and broadly described herein, a method for manufacturing a transistor comprises forming a photoresist pattern on a semiconductor substrate including an isolation layer, forming a drift region by implanting first and second dopant ions using the photoresist pattern as a mask, forming a gate oxide layer on the semiconductor substrate, forming a poly gate on the gate oxide layer, forming source and drain regions a predetermined distance from the poly gate, and forming a silicide layer on the above structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to preferred embodiment(s) of the present invention, examples of which are illustrated in the accompanying drawings. Wherever possible, the same reference numbers will be used throughout the drawings to refer to the same or like parts.

FIG. 2A to FIG. 2D are cross-sectional views illustrating exemplary processes of manufacturing a DEMOS transistor according to embodiments of the present invention.

Figure 1A:
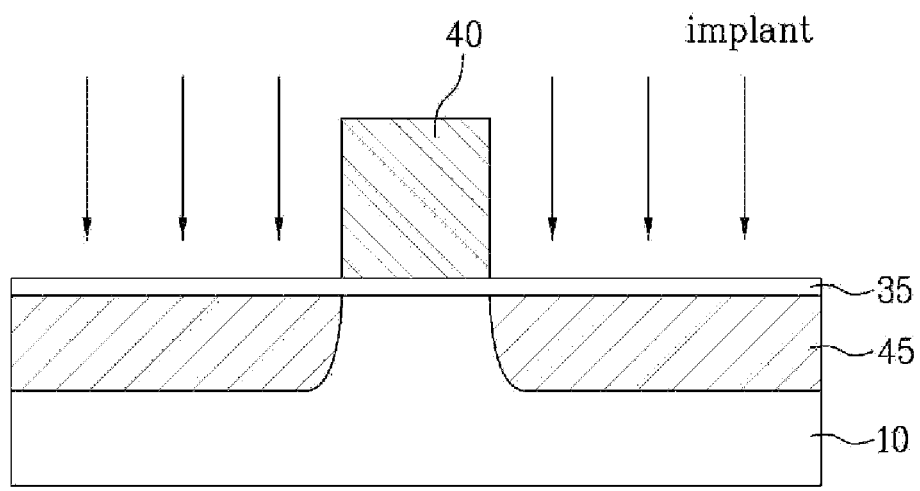
FIG. 1A to FIG. 1D are cross-sectional views illustrating the manufacturing processes of a DEMOS transistor according to a conventional art.
Figure 1B:
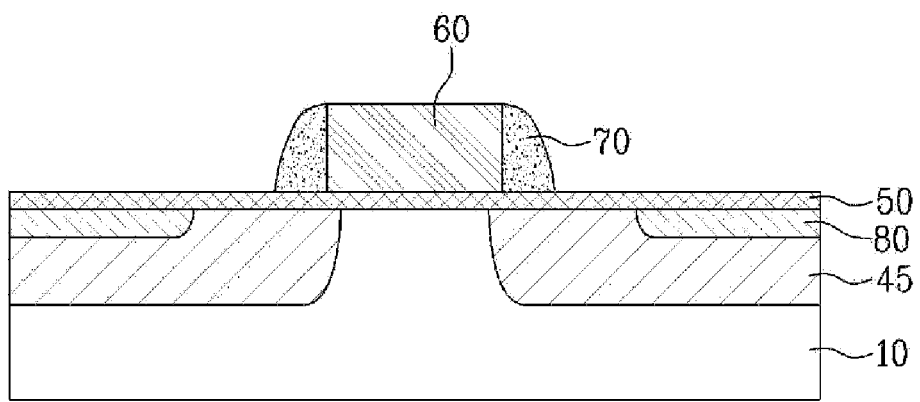
Figure 1C:
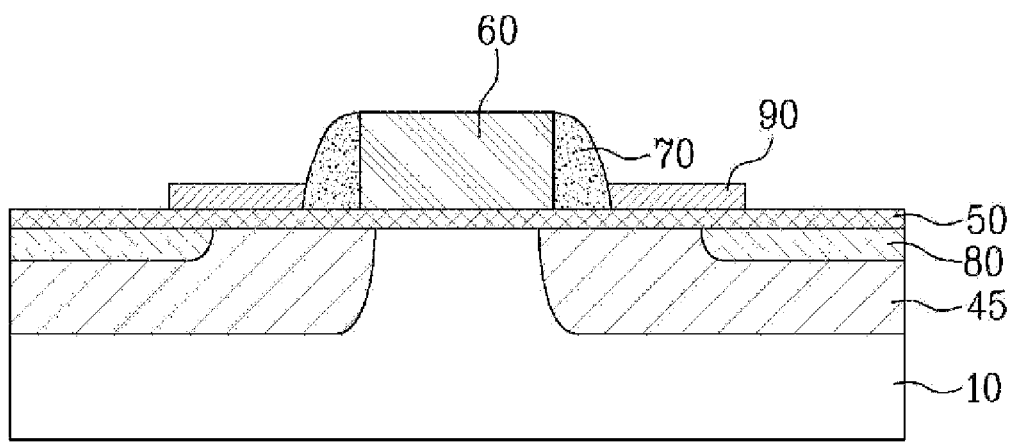
Figure 1D:
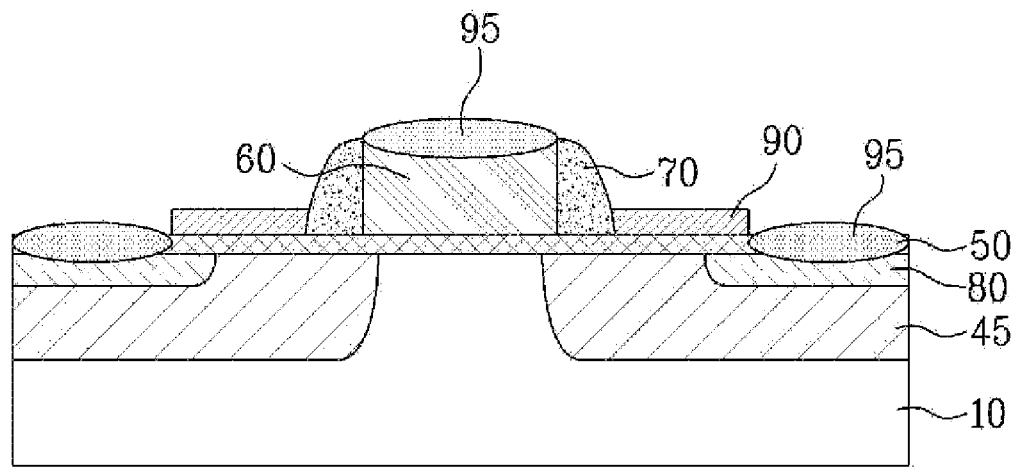
Figure 2A:
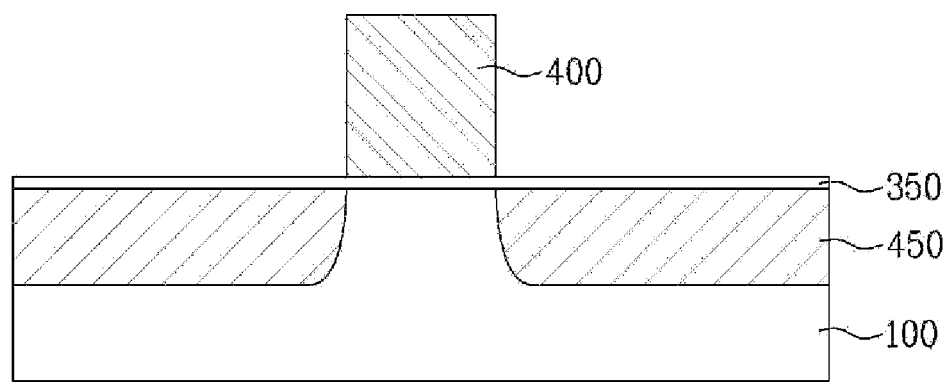
FIG. 2A to FIG. 2D are cross-sectional views illustrating exemplary processes of manufacturing a DEMOS transistor according to embodiments of the present invention.

Referring to FIG. 2A, the DEMOS transistor comprises a plurality of active regions (for example, p-wells; not shown) defined on a semiconductor substrate 100. A barrier oxide layer 350 and a nitride layer (not shown) are deposited on the active region 200 (e.g., by chemical vapor deposition, or CVD). Then, an isolation layer (not shown) by shallow trench isolation (STI). The STI layer separates the active regions of the substrate.

A photoresist pattern 400 is formed using photolithography, and a drift region 450 is formed by ion implantation using the photoresist pattern as a mask. In general, conditions for forming drift region 450 are similar to or the same as those for forming a lightly doped drain (LDD) region. During the formation of the drift region 450, two ion implantations are performed. Boron ions are implanted at a higher dose or density than phosphorus ions, but at a relatively low energy (e.g., very shallow in a surface of the substrate 100). The phosphorus ions, implanted at a lower dose or density than the boron ions, are implanted at a relatively high energy (e.g., relatively deep into the substrate).

Figure 2B:
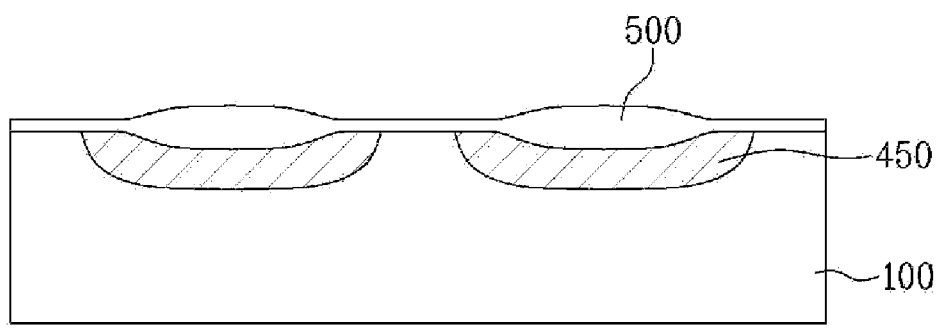

As shown in FIG. 2B, next, post-ion implant wafer cleaning and annealing are performed. For example, the photoresist pattern 400 is removed by ashing in a plasma formed from oxygen gas, and the wafer may be wet cleaned with an organic and/or basic cleaning solution to remove residual photoresist. Annealing is generally performed at a temperature and for a length of time sufficient to activate the dopant ions implanted into the wafer, and optionally repair any incidental damage to the wafer resulting from ion implantation. In one embodiment, annealing may improve cohesion between the implanted dopant ions and silicon atoms.

Additionally, a gate oxide layer 500 is grown on the semiconductor substrate 100. In the above process, the shallowly implanted high-density boron ions are diffused while being oxidized. Therefore, the surface of the semiconductor substrate 100 into which the boron and phosphorous ions are implanted may be oxidized at a higher rate than those areas covered by the photoresist pattern 400, and gate oxide 500 is thicker in the implanted regions. The difference in thickness between the implanted regions and the masked regions can be from 5 to 100 Å, or any range therein (e.g., 10-50 Å). The phosphorus ions form the drift region 450.

Figure 2C:
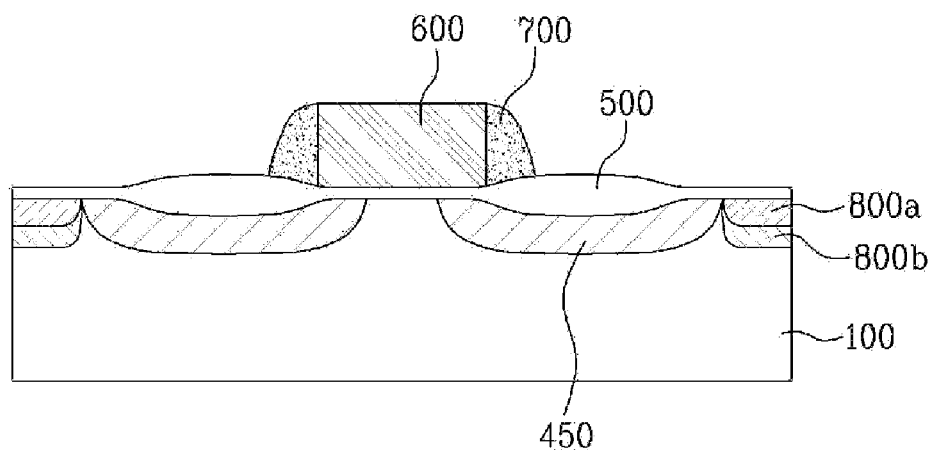

Next, as shown in FIG. 2C, a silicon layer is deposited (e.g., by CVD, which may be plasma-assisted or plasma-enhanced) on the gate oxide layer 500. The silicon layer is then annealed to crystallize the silicon and form a polysilicon layer. Afterward, a poly gate 600 is formed by photolithography and etching processes.

Spacers 700 are formed on sidewalls of the poly gate 600, and source and drain regions 800a and 800b are formed at a predetermined distance from the poly gate 600. In one embodiment, source and drain regions 800a and 800b are formed by double ion implantation. During this double ion implantation, the thickly formed part of the gate oxide layer 500 performs a self-aligning function, thereby improving the matching characteristics of the implant regions in the transistor, among transistors on the wafer, from wafer-to-wafer, and/or from lot-to-lot. In addition, since the thick part of the gate oxide layer 500 increases the length of the drift region 450, a device capable of functioning as a laterally diffused MOS (LDMOS) transistor can be achieved. As a result, the size of the device can be reduced.

Figure 2D:
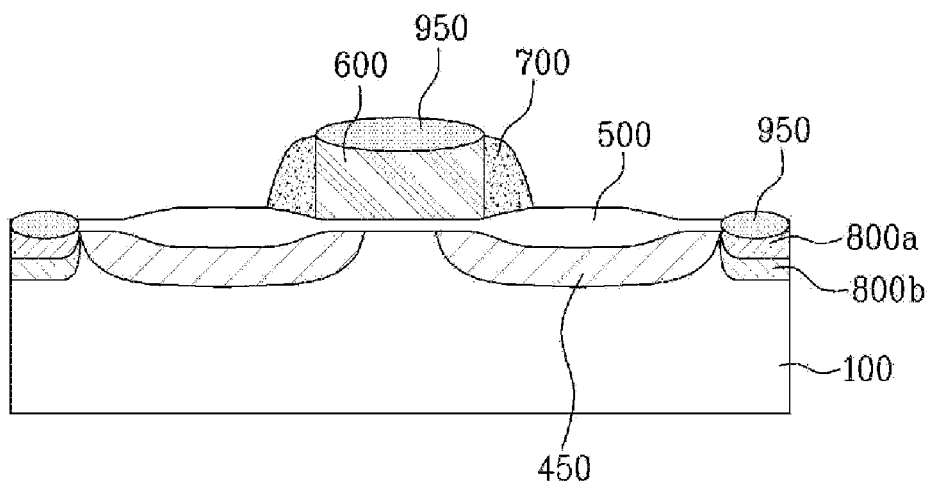

Next, as shown in FIG. 2D, a metal is deposited (e.g., by sputtering or CVD) on the whole surface of the wafer, and thermal processing and annealing are performed to form a silicide layer 950.

As apparent from the above description, in accordance with the method for manufacturing a transistor according to any of the above-described embodiments of the present invention, the length of a drift region can be increased by growing a relatively thick gate oxide in implanted regions, thereby achieving a device functioning as an LDMOS transistor. Consequently, the device size can be reduced. In addition, since the thickened gate oxide layer is capable of self-alignment during source and drain implantation, the matching characteristics among transistors can be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a transistor comprising:
    forming a photoresist pattern on a semiconductor substrate including an isolation layer;
    forming a drift region by implanting first and second dopant ions using the photoresist pattern as a mask;
    forming a gate oxide layer on the semiconductor substrate;
    forming a poly gate on the gate oxide layer;
    forming source and drain regions a predetermined distance from the poly gate; and
    forming a silicide layer on the poly gate and the source and drain regions.

2. The method according to claim 1, wherein the first dopant ions are implanted at a higher dose or density and at a lower energy than the second dopant ions.

3. The method according to claim 1, wherein the second dopant ions are implanted at a lower dose or density and at a deeper position from the surface of the semiconductor substrate than the first dopant ions.

4. The method according to claim 1, wherein the first dopant ions are boron ions and the second dopant ions are phosphorus ions.

5. The method according to claim 1, further comprising forming spacers on sidewalls of the poly gate.

6. The method according to claim 1, wherein the gate oxide layer is formed thicker on the drift region than the masked parts.

7. The method according to claim 6, wherein a thickly formed part of the gate oxide layer performs a self-aligning function during the source and drain implantation.

8. The method according to claim 6, wherein the length of the drift region is increased by the thick part of the gate oxide layer.

9. The method according to claim 1, wherein forming the source and drain region comprises a double ion implantation.

10. The method according to claim 9, wherein, in the source and drain region, a source region is formed on a drain region by double ion implantation.

11. The method according to claim 1, wherein forming the drift region comprises a lightly doped drain (LDD) implantation using the photoresist pattern as a mask.

12. The method according to claim 1, further comprising, after the drift region is formed, cleaning and annealing the semiconductor substrate.

* * * * *